United States Patent [19]

Nigg

[11] Patent Number: 5,015,917

[45] Date of Patent: May 14, 1991

[54] ADAPTOR FOR SMALL FLUORESCENT TUBES

[76] Inventor: Juerg Nigg, Beckenhofstrasse 30, CH-8006 Zurich, Switzerland

[21] Appl. No.: 427,146

[22] Filed: Oct. 25, 1989

Related U.S. Application Data

[63] Continuation-in-part of Ser. No. 815,085, Feb. 7, 1986, abandoned.

[30] Foreign Application Priority Data

| | | | |
|---|---|---|---|
| Apr. 9, 1984 | [CH] | Switzerland | 1772/84 |
| Jun. 6, 1984 | [CH] | Switzerland | 2778/84 |
| Jan. 25, 1985 | [CH] | Switzerland | 352/85 |
| Feb. 7, 1985 | [CH] | Switzerland | 555/85 |
| Apr. 4, 1985 | [WO] | World Int. Prop. O. | PCT/CH85/00056 |

[51] Int. Cl.$^5$ ........................ H05B 41/00; H05K 7/10; F21S 5/00; F21V 29/00

[52] U.S. Cl. ........................................ 315/56; 361/409; 362/216; 362/260; 362/264; 362/267; 362/276; 362/282; 362/284

[58] Field of Search ..................... 315/56, 58, 71, 151, 315/DIG. 5; 361/399, 400, 404, 405, 408, 409, 417, 419, 420; 362/216, 217, 257, 260, 263, 264, 267, 282, 283, 284, 276, 297, 310

[56] References Cited

U.S. PATENT DOCUMENTS

| | | | |
|---|---|---|---|
| 4,300,073 | 11/1981 | Skwirut et al. | 315/53 |
| 4,366,416 | 12/1982 | Yokoyama | 315/58 |
| 4,473,770 | 9/1984 | Baba et al. | 313/318 |
| 4,503,358 | 3/1985 | Kamei et al. | 315/58 |
| 4,503,360 | 3/1985 | Bedel | 315/112 |
| 4,544,863 | 10/1985 | Hashimoto | 315/209 R |
| 4,570,105 | 2/1986 | Engel | 315/58 |
| 4,654,557 | 3/1987 | Haraden | 313/318 |
| 4,879,494 | 11/1989 | Tuttle | 315/61 |

*Primary Examiner*—David Mis

*Attorney, Agent, or Firm*—Thomas W. Speckman; Douglas H. Pauley

[57] ABSTRACT

An adaptor for fluorescent tubes having contact pins, the adaptor having a fluorescent tube-compatible plug-in socket and an incandescent lamp-compatible screw cap. The adaptor having an external casing. The external casing having the incandescent screw cap. A printed circuit board and an inner casing are both secured to the incandescent lamp-compatible screw cap. The inner casing part having a fluorescent tube compatible plug-in socket and the inner casing having a socket area which has a plurality of contact members. The contact members are electrically connected by bridges on the printed circuit board. A flexible connection of the inner casing to the light fittings is created. The fluorescent tube-compatible plug-in socket receives different shaped caps of the light fittings.

22 Claims, 8 Drawing Sheets

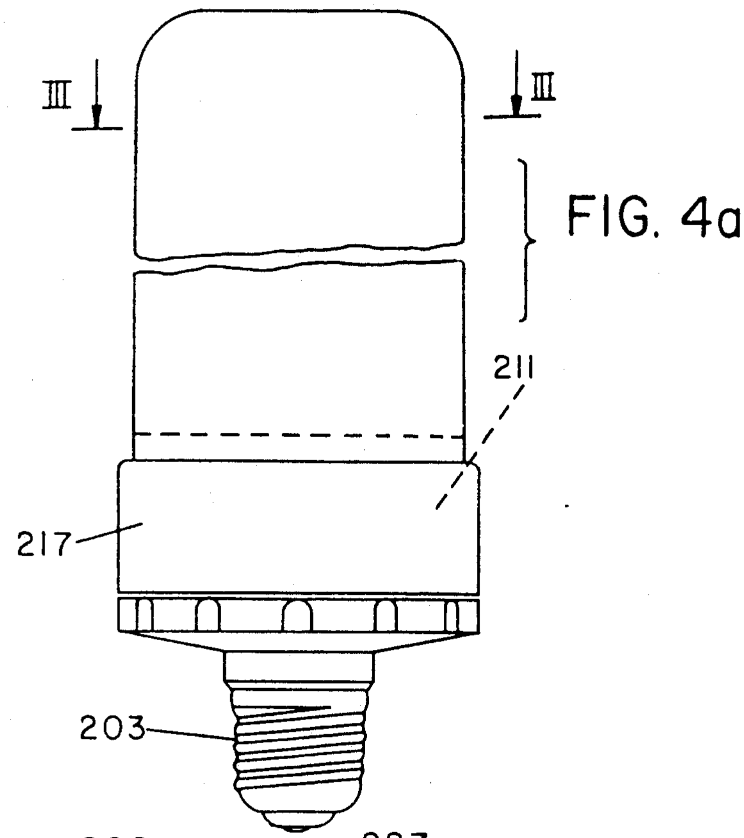
FIG. 4a
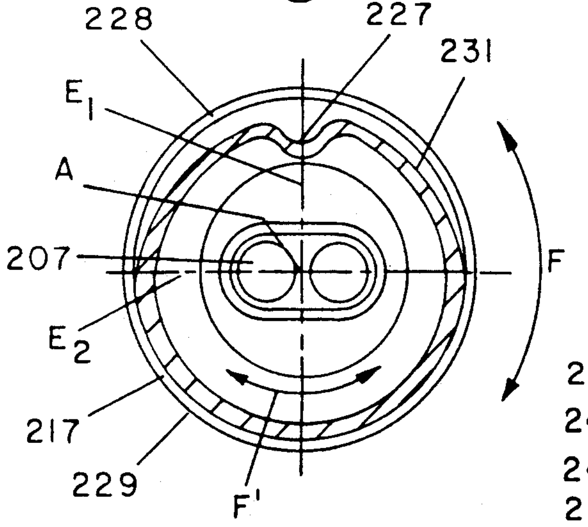
FIG. 4b
FIG. 5
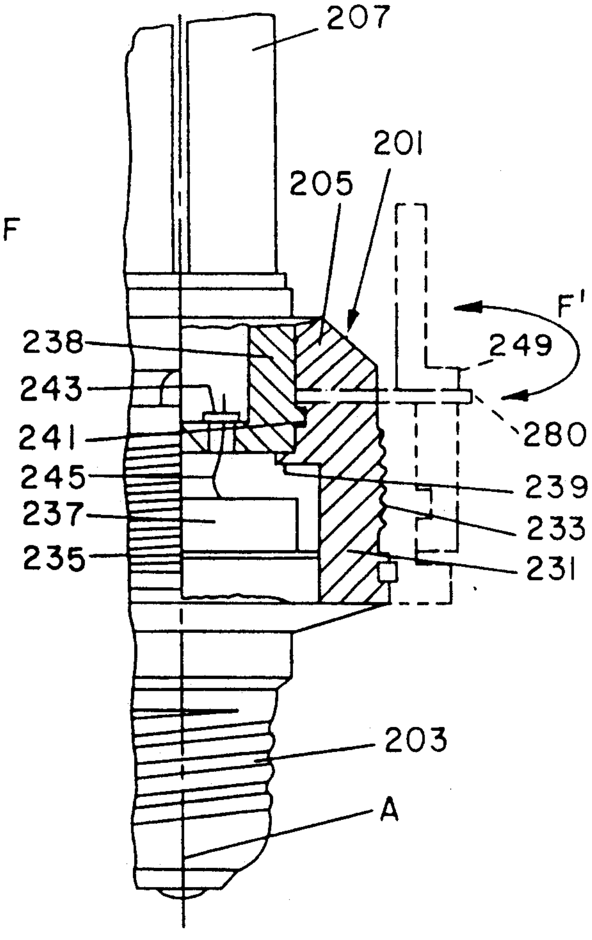

ADAPTOR FOR SMALL FLUORESCENT TUBES

CROSS REFERENCES TO RELATED APPLICATION

This application is a continuation-in-part of copending application, Ser. No. 815,085, filed Feb. 7, 1986, abandoned.

BACKGROUND OF THE INVENTION

1. Field of the Invention

The present invention relates to an adaptor for small fluorescent tubes with contact pins. The adaptor comprises a fluorescent tube-compatible socket and an incandescent lamp-compatible, feed-side screw or bayonet cap, an outer casing part with an incandescent lamp-compatible cap, a printed circuit board which is held in the compatible cap and an inner casing part with a fluorescent tube-compatible socket.

2. Description of the Prior Art

The German patent, DE C 2819550, discloses an adaptor suitable for connecting a circular fluorescent tube. This adaptor has an outer casing part with a feed-side incandescent lamp-compatible socket, an inner casing part with a fluorescent tube-compatible socket, and a printed circuit board for receiving a circuit arrangement for electrical matching purposes. This adaptor can also be joined along a joining axis and is rotationally symmetrical. However, the overall design is only for fluorescent tubes of one type. The adaptor would become unusable for changing the electrical or mechanical requirements. The overall construction is extremely voluminous and it is not possible to use an energy-saving fluorescent tube in an existing light fitting, such as hanging or standing lamps. This design would not allow the desired, more widespread use of energy saving lights.

Attempts have been made in lighting technology to obtain the energy consumption savings of fluorescent tubes in place of light bulbs. Thus, for example, fluorescent tubes are known, such as the Osram COMPACTA tubes, which the lighting body comprises a fluorescent body integrated with the electrical ballast and starter necessary for main voltage in a single casing. The casing is provided with a bulb, namely a screw cap, enabling the fluorescent tube to be screwed into conventional incandescent lamp sockets. By integrating the starter, ballast and fluorescent material lighting body in one casing, the lighting elements become heavy and expensive. In the case of a failure of the fluorescent body only, the entire lighting element has to be thrown away, including the completely intact starter and ballast.

In addition, small fluorescent tubes are known which are provided with special caps, in which are fitted solely with the starter and a capacitive ballast. These small fluorescent lamps are much less costly, but cannot be fitted in conventional incandescent lamp caps. Manufacturers of such small fluorescent tubes therefore market inserts, which can be fitted in a fixed manner and cabled to the main voltage supply. Compared with incandescent lamps, the use of fluorescent tubes usually leads to a significant operating savings.

SUMMARY OF THE INVENTION

The present invention provides an adaptor permitting the use of fluorescent tubes, which are advantageous from the energy consumption purposes, in place of conventional incandescent lamps. Additionally it is possible to provide an electrical adaptor between the incandescent lamp supply and the fluorescent tube supply with corresponding electrical units, which do not have to be replaced if the fluorescent tube fails.

The present invention also provides an adaptor or ballast of the aforementioned type, which can be assembled in a highly flexible manner for differently capped and electrically operated lighting systems. While these systems use the same basic components and the volume is reduced to an absolute minimum, electrical-electronic units are required for the bringing about of the aforementioned compatibility. The term adaptor is used for a device, which on the main voltage side has a socket or cap, but if it has cable connections it is referred to as a flexibly constructable ballast.

As a result of this single difference reference is only made to adaptors, unless said difference is dealt with hereinafter. The indicated objective is achieved in that the adaptor or ballast of the aforementioned type has a modular construction and comprises an outer casing part with connecting means, such as a socket cap, for main voltage connection, at least one printed circuit board for electrical members for providing the lighting body compatibility supply, as well as an inner casing part with the socket for the lighting body, the external volume of the adaptor or the ballast being established by the outer casing part and the inner casing part.

A problem when designing an adaptor of the aforementioned type is that different manufacturers market different lighting units, which have the same cap dimensions, but the electrical connections, such as terminal pins are positioned differently, but still within the scope of a constant grid. It can be determined which positions within a cap the electrical contacts can be positioned. It cannot be determined from the outset where these contacts are located in tubes. Apart from different pin arrangements, certain lighting units also have different cap or socket forms, e.g. those of DIN g 23 d-1; g 24 d-1; g 24 q-1, etc.

In order to fully utilize the modular concept of the proposed adaptor and not to provide for each individual insert different inner casing parts with the lighting unit socket, it is an object of the invention to provide a plurality of contacts arranged in DIN-grid manner in the socket area of the inner casing part. One part is electrically wired for lighting units with geometrically differently arranged electrical contacts in the cap area thereof and/or one part is electrically differently wired or, such as via bridge parts on the printed circuit board, can be wired for flexible adaptation of the same inner casing part to the electrical and mechanical requirements of different lighting units. It is preferable that the socket is shaped so that different shaped caps can be held by the lighting units.

It is an object of the invention to achieve a very small, low overall adaptor height for the insert with the lighting units having contact pins in the cap area. The present invention provides on the inner casing part receptacles, such as bores, for the pins and resilient contact members for the pins are fixed to the printed circuit board. Thus, between the pin contact system on the adaptor side and the printed circuit board with the electrical and electronic members, not forming part of the present invention, a minimum distance is achieved. This minimum distance has an effect on the overall height of the adaptor and makes it unnecessary to provide additional connections between the pin contact system and the printed circuit board.

Conventional contact members for the contacting of pins have a relatively complicated shape and have a particular curved or bent in two-dimensional shape, such as in channel-like shape, for grasping the pins. Another object of the invention is to obtain ease of manufacturing and to achieve a minimum space requirement per pin contact point on the adaptor. Also of importance is that more contact areas are provided than are actually necessary and the flexibility of the same adaptor construction increases with the increase in the number of contact areas provided.

It is still another object of the invention to shape the contact members from plate-like material, e.g. by punching. Thus, the width dimension of a contact member is limited to the thickness of the plate-like material. A large number of contact areas can be made available. The manufacture of the individual contact members does not require complex shaping processes and one punching process will suffice.

In principle, the contacting of contact pins on the lighting units is achieved through a U-shaped construction of the contact members. U-legs are centered with the receptacles for the lighting unit pins. At least the leg portions of the U-shaped contact members are resilient. The inserted contact pins are resiliently contacted on two sides with the contact members and consequently a good contacting of the pins is ensured even during long operating periods and in the case of vibrations. Reference is made in this connection to the unconventional spring loading of the contact members in the plane of the plate material.

It is known that the conventional plate materials used for printed circuit boards are relatively elastic within certain limits. Prior to reaching these limits, stressing within the board elasticity can lead to cracks in the printed conductors. Adequate support of the printed circuit board in the vicinity of the contact members must be ensured, because the contact part stressing occurs upon inserting a light fitting and therefore on the board stressing, because the contact members are mounted directly thereon. Due to the fact that the contacts on the board comprise mechanically fixed contact members, the contact members have bearing parts for supporting the board in the inner casing part. The contacts serve to contact the light fitting connections or terminals and also act as support members for the printed circuit board ensuring optimum support in this important area. This is achieved by at least one U-leg that is provided on its side remote from the U-base with a bearing part. The inner casing part has a counterbearing part for securing the board on the inner casing part. Thus, the outer part of the U-leg not having a contacting action, is utilized in an optimum manner for supporting the board. Only the facing, inner U-leg portions are used for contacting the light fitting pins.

Due to the fact that the bearing portion is constructed in a barb-like or sharp projection extending backward manner, the U-legs project at least approximately parallel to an assembly axis of the printed circuit board and inner casing part. The U-legs project in such a way that on assembling the board and inner casing part, that the bearing portions resiliently snap behind counterbearing portions on the inner casing part within the scope of the snap spring system of the barb-like bearing portions and a clearance-free board fixing is achieved. This simultaneously brings about a very simple fitting of the printed circuit board to the inner casing part.

At least one of the U-legs has a shaped-out portion directed towards the U-central axis. This is achieved when inserting the light fitting and under the action of its contact pin, the U-leg is resiliently bent away from the U-central axis, so that a resilient contact portion bias is achieved for obtaining electrical transfer.

When connecting commercially available light fittings or lighting units with pin terminals, the pins are formed by small tubes. The pins contact the light fitting side at an impression point, i.e. in light fitting-like manner a wire is inserted in the tube and from the outside, a clamping impression is provided at a narrowly defined point. Although these impressions are not accurately positioned, they are always on the same pin side with respect to the light fitting cap. In the case of the aforementioned, U-shaped contact members form an optimum contact with respect to the pins. This is achieved by the shaped-out portion having an edge, which is particularly important for contacting pins which are already corroded. However, at the aforementioned impression point, an edge can engage on the pins, which prevents a complete insertion of the light fitting, as a function of the spring action of the corresponding U-leg. In order to counteract this problem, another object of the invention is to provide the shaped-out portion having an edge directed against the U-central axis to ensure a good electrical transfer. The shaped-out portion may also be constantly curved to prevent a snapping into the impression point. It is preferable that the shaped-out portion having an edge on one leg and that on the other leg is constantly curved, so that a bent shaped-out portion ensures the good electrical contact. The curved leg in the vicinity of the impression point prevents a snapping into the latter and still resiliently contacts the pin.

As stated above, the contact members are secured to the printed circuit board. Therefore, the board is located in the immediate vicinity of the light fitting socket and passes through the light fitting socket. The contact pins must project through to the printed circuit board height, in order for there to be contact by the contact members. Thus, keeping the overall height as low as possible, this ensures that the fitting side of the adaptor. It must also be ensured that the board is positioned as high as possible with respect to the light fitting side, because the free space on the opposite side of the board is lost. In order to permit this, it is proposed that the base of the U-members have on one side an extension portion. That the member with the extension portion is fixed in a closely engaged manner on one board side. The leg extends through at least one opening in the board on its other side in such a way that the extension portion absorbs the stressing moments occurring when it bears against the printed circuit board on inserting the light fitting. The fixing of the constructed U-contact member is achieved by the extension portion having at least one pin projecting roughly parallel to the U-legs. The extension portion is shaped approximately in the central region of the extension portion, which projects through an opening in the printed circuit board and on the board side remote from the extension portion is connected to the board.

Once assembling such an adaptor, it cannot be disassembled by the user, preventing electrical accidents. This is achieved by the inner casing part engaging with outer faces of resilient wall portions on the inner wall the at least partly bush-shaped outer casing part, preferably by means of a barb-like shaped-out portion on the wall portions in a groove on the inner wall of the outer casing part. An expanding device is provided, preferably in the form of an expanding bracket. The expanding device is in connection in an expanding manner with the inner faces of the wall portions of the inner casing. The expanding device is preferably in locking connection with the inner faces of the wall portions of the inner casing so that through the spreading action of the spreading device on the wall portions, the latter is non-destructively, non-detachably fixed in its connection to the outer casing part after assembly. This results in an assembled adaptor that cannot be disassembled without destroying it. Simultaneously the spreading device is preferably used for supporting the printed circuit board on areas of its periphery. The spreading or expanding members, for example, the expanding brackets, spread the wall portions of the inner casing part outwards, so that the latter must be resiliently compressed for inserting in the outer casing part. After insertion with their barb-like shape-out portions engage in the groove on the outer casing part and are locked there, as a result of the expanding action of said expanding devices.

If one fitting side of the printed circuit board is not spatially sufficient for obtaining all the electrical members for providing a main voltage lighting unit compatibility, then it is proposed to successively stagger several printed circuit boards with at least approximately parallel planes.

In order to extend the proposed adaptor with respect to its flexibility of use, it is proposed that the outer casing part has fastening members, such as an external thread for the arrangement of lamp cups in any desired manner. It is proposed to insert between the outer and inner casing parts sealing members, for example, an O-ring seal, when using the adaptor in a moist environment.

When utilizing the rotation mobility of the cup, it is also proposed that the cup have areas of different light transmission or reflection, so that by rotating the cup the user is able to influence the light appearance or incidence.

It is known that certain light fittings do not have a rotationally symmetric appearance. Instead these light fittings may have two projecting fluorescent tube legs projecting in one plane, for example, the Osram DULUX fluorescent lights.

It is also known that the light yield of a light fitting is dependent on its temperature. The latter also having an effect on the temperature of the immediate area around the light fitting. In order to ensure a substantially constant and preselectable operating temperature of such a light fitting, it is proposed that a temperature sensor is provided, accompanied by means for adjusting the cup heat transmission or reflection, which are influenced by the sensor. If the cup has at least two casing portions rotatable coaxially relative to one another, one cup has a sequence of axial segments with a relatively high infrared reflection and a relatively high infrared transmission, as does the second, and the heat sensor controls the relative rotation position of the casing portions.

If the segments with a relatively high infrared refection of both casing portions are superimposed, then the complete cup transmission is relatively high. If the segments of the two casing portions with a relatively high infrared reflection are juxtaposed, then the complete cup reflection is high. Thus, by relative adjustment of the two casing portions, controlled by the temperature sensor, it is possible to significantly influence the internal temperature of the cup and the light fitting temperature. Preferably the sensor is a bimetal spiral that is mechanically connected on one side with one of the casing portions and is fixed on the other side.

By constructing the adaptor in such a way that the light fitting is adjustably positioned, the possibility exists of attaching to the light fitting connecting parts a reflector. By moving or adjusting the connection point with respect to the opposite connection, such as the main voltage and with respect to a room to be illuminated, it is possible to position the reflector.

BRIEF DESCRIPTION OF THE DRAWINGS

FIG. 4*a*, a side view of the adaptor and cup according to FIG. 3.

FIG. 4*b*, a section along line III—III of FIG. 4*a*, the cup being axially asymmetrically constructed and provided with a reflector or filter.

FIG. 5, the side view of a partial cross-sectional detail of the arrangement according to FIG. 2 with a rotary light fitting connection.

DESCRIPTION OF PREFERRED EMBODIMENTS

Figure 1:
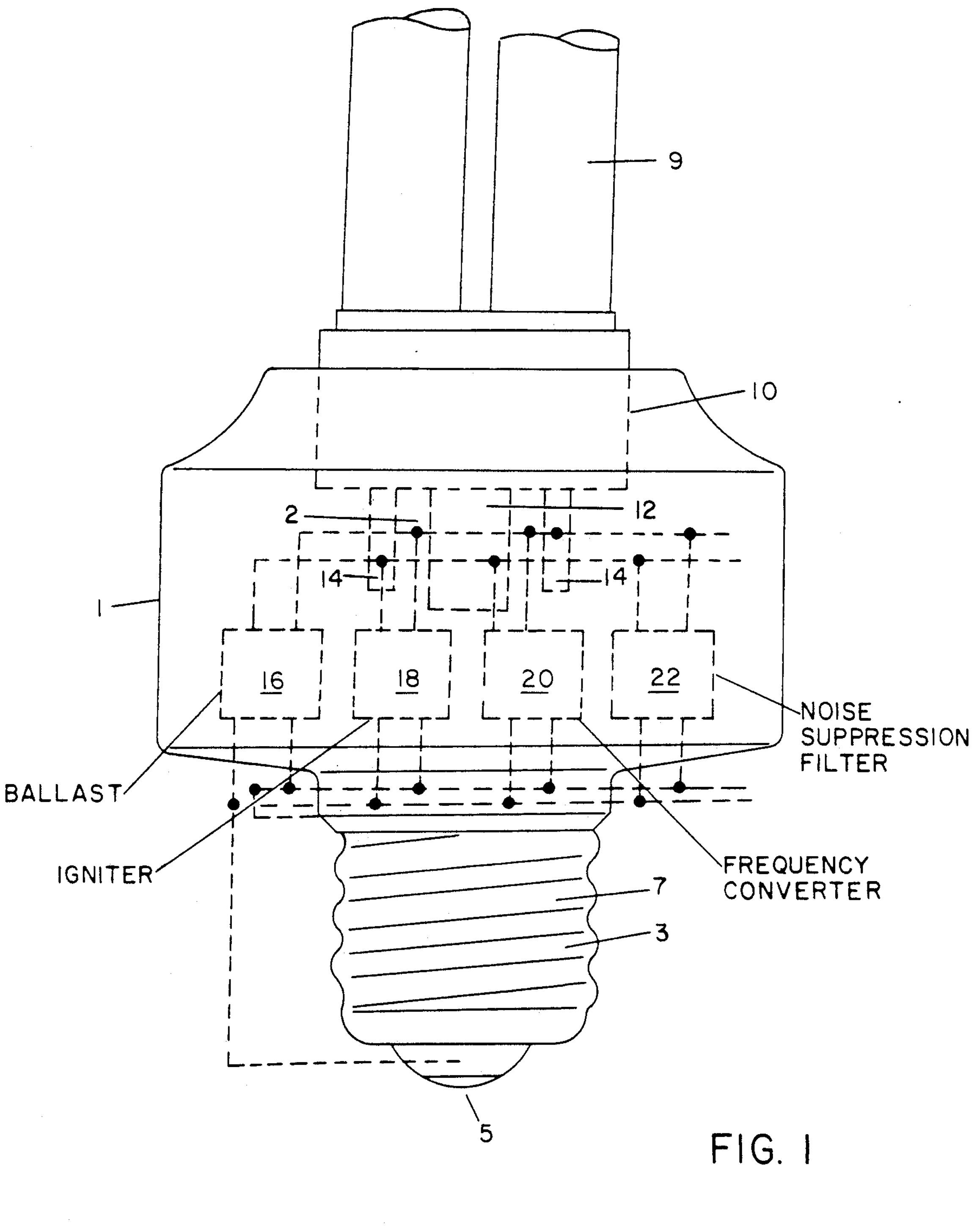
FIG. 1, an adaptor in side view.

According to one preferred embodiment of this invention as shown in FIG. 1, the adaptor comprises a two-part casing 1 constructed of insulating material, preferably plastic. As shown in FIG. 1, one side carries an incandescent lamp-compatible screw cap 3 which is familiar in the art, and has electrical connection 5 and 7 to which main voltage is applied. The opposite side of casing 1 has a socket 2 for another lamp type, such as a DULUX mini-fluorescent tube manufactured by Osram. As shown in FIG. 1 the lamp comprises a light fitting 9, luminescent material body, and a ceramic cap 10 which comprises a central core 12 with electrical terminals 14. As shown, the ceramic cap 10 of the fluorescent tube is different from conventional incandescent lamps. Depending on specific requirements, casing 1 contains integral electrical or electronic units necessary for producing electrical compatibility between the main voltage supplied for a fluorescent tube. Between the electrical connections 5 and 7 on the incandescent lamp screw cap side and the electrical connections on the fluorescent tube socket side, the adaptor can include ballast 16 and/or igniter 18 and/or a frequency converter 20 and/or an interference or noise suppression filter 22. Conventional ballast 16, igniters 18, frequency converters 20 and noise suppression filters 22 are familiar to the art and are designed as a function of the input-side electrical conditions with respect to the secondary-side conditions necessary for the operation of luminescent material body of a light fitting.

Figure 2:
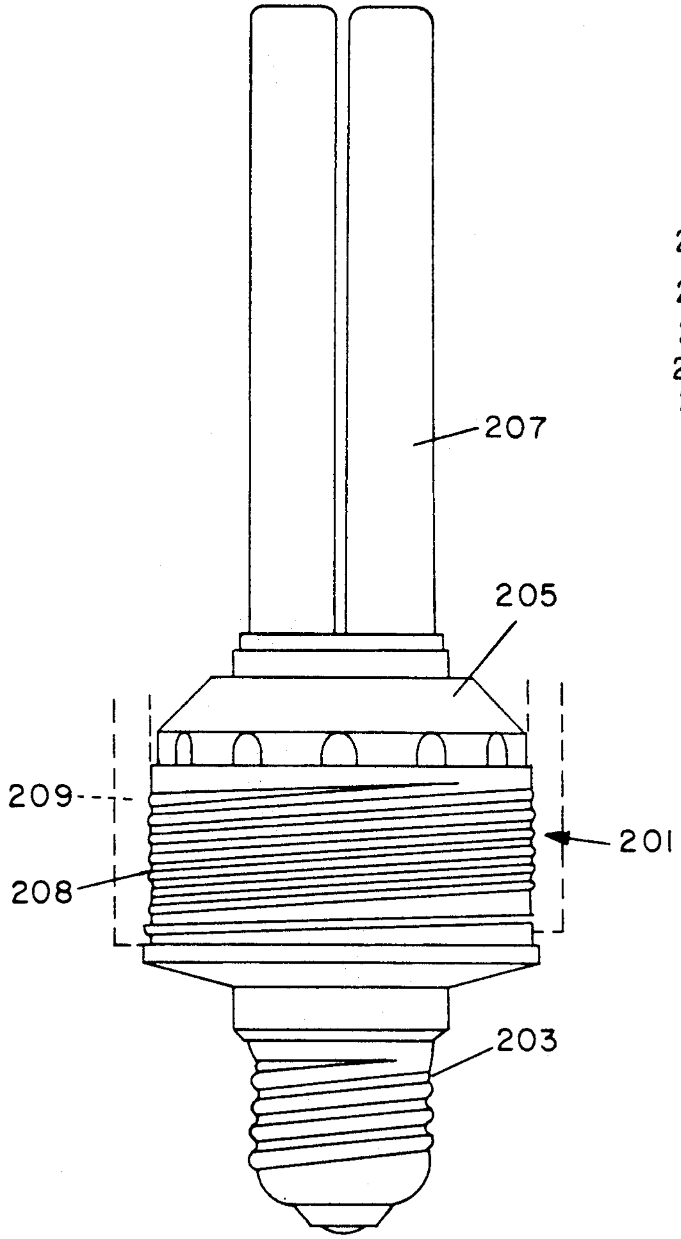
FIG. 2, a side view of an adaptor with fitted fluorescent tube, e.g. an Osram DULUX mini-fluorescent tube.

FIG. 2 shows one preferred embodiment of adaptor 201 having one side with a screw cap 203 for conventional main voltage connection, such as for incandescent lamp sockets. Referring to FIG. 2, adaptor 201 has a connection socket 205 for connecting a light fitting 207. In FIG. 2, light fitting 207 is represented in the form of an Osram DULUX mini-fluorescent tube which is not mechanically compatible with an incandescent lamp socket. Adaptor 201 also contains electronics for producing the electrical compatibility. Adaptor 201 has external threads 208 for mating with internal threads of a cover, such as a glass cover, and for retaining such cover in a fixed position with respect to adaptor 201.

Figure 3:
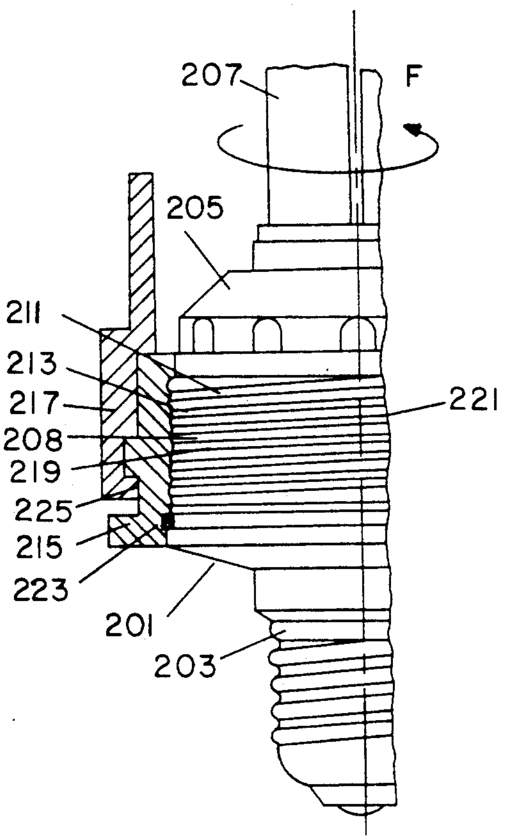
FIG. 3, the side view of a partial section of the adaptor according to FIG. 2 with a rotary cup.

According to FIG. 3, adaptor 201 comprises a support part 211, the light fitting connection socket 205 and the incandescent lamp screw cap 203. On the external thread 208 of support part 211 is provided a support ring 215, which has an internal thread 213 and carries a cup 217. In cup 217 is formed a circular groove 219, which engages with a circular bead 221 on the support ring 215. Thus, following the engagement of circular groove 219 and circular bead 221 it is possible to turn cup 217 with respect to ring 215, part 211 and therefore light fitting 207, as indicated by arrow F. An O-ring seal 223 is positioned between part support 211 and support ring 215, as well as indicated at O-ring arrangement 225 between cup 217 and support ring 215 secure with respect to the outside the sealing parts of the cup interior.

FIGS. 4 and 4*b*, respectively, show a side view and a sectional view along line III—III, of FIG. 4*a*, which is another embodiment of FIG. 3. As shown in FIG. 4*b*, cup 217 is axially symmetrical and has an axial constriction part 227 and a circular cylinder segment 229. If the constriction part 227 is in a first plane $E_1$ passing through a center line axis A and the center axis A is defined as a function of a second plane $E_2$, at right angles to plane $E_1$, cup portion 228 fixed by the plane $E_2$ and the constriction part 227 as a reflector or filter 231. As shown in FIG. 3, by turning cup 217 and by modifying the position of reflector or filter 247 with respect to the light fitting 207, it is possible to vary the light appearance of the overall light pattern with respect to the surrounding area.

FIG. 5 shows a partial cross-sectional side view of another embodiment of the adaptor 201, as shown in FIG. 2. Adaptor 201 with light fitting connections socket 205 and incandescent lamp screw cap 203 has a cylindrical sleeve 231, which is secured to screw cap 203. Cylindrical sleeve 231 has an external thread 233 and interior support plate 235 upon which electronic unit 237 for the electrical or main voltage operation of the light fitting 207. On the light fitting side an insert 238 is mounted in cylindrical sleeve 231 so as to rotate with respect to the longitudinal axis of adaptor 201 as indicated by arrow F'. Insert 238 rests axially on a circular shoulder 239 shaped out of cylindrical sleeve 231 and is axially secured on the latter by a circular groove/notch connection 241. Insert 238 carries connection socket 205 for light fitting 207. The electrical connection between electronic unit 237 and electrical terminals 243 on insert 238 for light fitting 207 is provided by flexible cable 245. Thus, in this embodiment, the connection socket 205 with the light fitting 207 can be rotated with respect to the second terminal, or incandescent lamp socket-compatible screw cap 203, relative to the longitudinal axis A of adaptor 201. In other embodiments, the longitudinal axis of the light fitting connection socket 205 need not coincide with the longitudinal axis A of the incandescent lamp cap 203, which may be located eccentrically or at an angle with respect to one another.

Figure 6A:
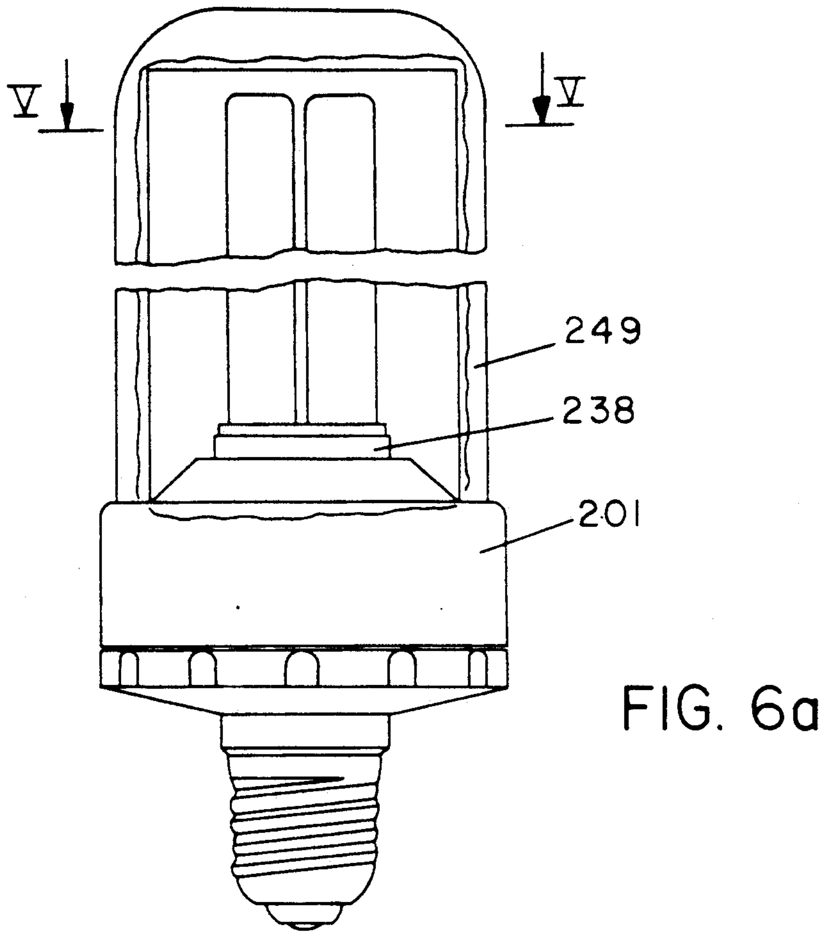
FIG. 6*a*, a side view of the arrangement according to FIG. 5, with a cup and with the light fitting connection a rotary reflector or filter.
Figure 6B:
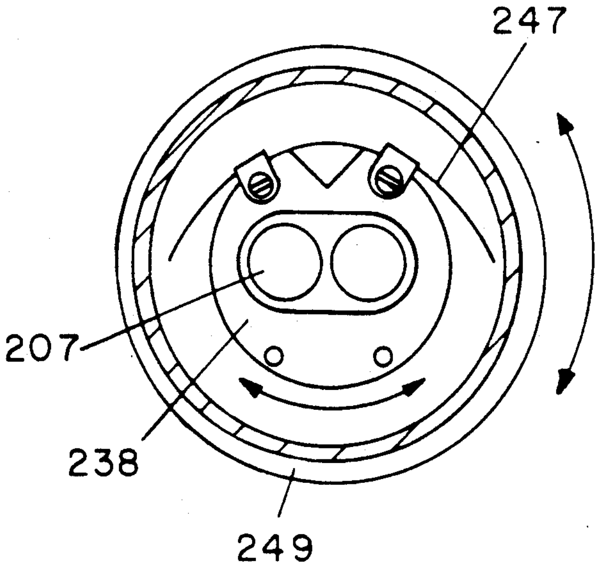
FIG. 6*b*, a section along line V—V of FIG. 6*a*.

FIGS. 6*a* and 6*b* show another embodiment of FIG. 5. In FIGS. 6*a* and 6*b*, a reflector 247 is provided in plug-in or fixed form on insert 238 in which the light fitting 207 is rotated. As shown by the dotted lines in FIG. 5, the light fitting 207 can be surrounded by a cover 249 which is rotatable relative to adaptor 201. Cover 249 can also be positioned in non-rotary adaptor 201. By rotating insert 238, light fitting 207 and reflector 247, a modification takes place to the light appearance pattern of the overall arrangement.

Figure 7:
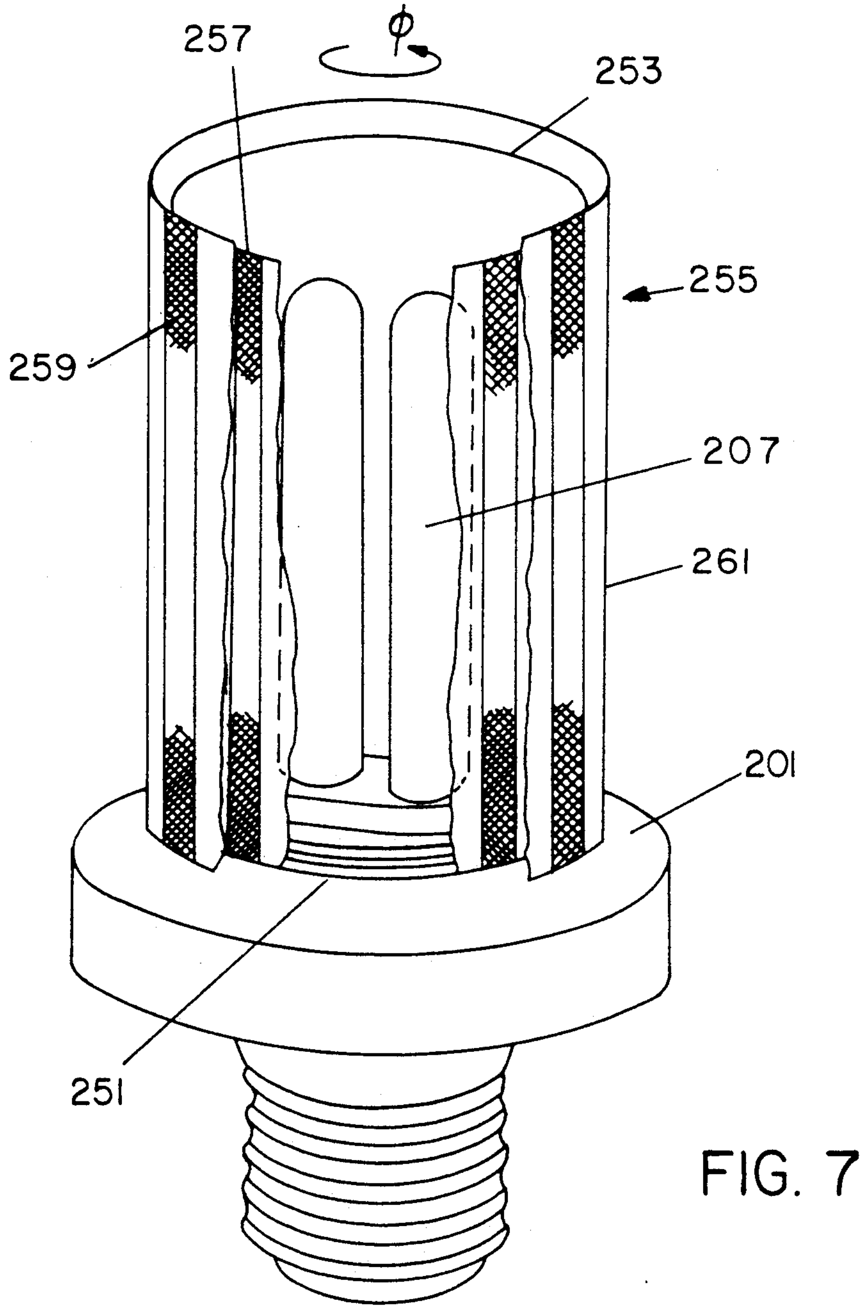
FIG. 7, a perspective view of an adaptor with temperature sensor and heat transmission or reflection influencing on a cup.

It is known that the light yield of a light fitting is dependent on its temperature. According to FIG. 7, in order to control the temperature, spiral bimetal thermal sensor 251 is secured to adaptor 201 with light fitting 207 and to an inner casing 253 of a thermal cup 255. As the temperature in the cup interior varies, thermal sensor 251 expands and contracts. The inner casing 253 is rotatably mounted relative to adaptor 201, and subdivided into segments with a high infrared transmission and those with a high infrared reflection. Inner casing 253 is positioned within outer casing 261 and attached to adaptor 201. Outer casing 261 is subdivided into power transmitting segments. As a function of the angular position of inner casing 253 with respect to outer casing 261 of thermal cup 255, the outer casing 261 reflects or transmits light. If the interior of thermal cup 255 is heated and the temperature reaches a predetermined level, then the expansion of the thermal sensor 251 rotates inner casing 253 relative to outer casing 261, which causes transmission of thermal cup 255 to increase. Conversely, cooling the interior of thermal cup 255 the contraction of thermal sensor 251 causes a displacement of the inner casing 253, so that thermal cup 255 has increased reflecting action and consequently reflects heat radiation back towards light fitting 207. Thus, the internal temperature of thermal cup 255, and indirectly the temperature of light fitting 207, can be kept relatively constant.

Referring to FIGS. 5, 6*a* and 6*b*, once cup 249 is screwed down or rotated, light fitting connection 205 and light fitting 207 become inaccessible and cannot be further rotated.

If such a rotation is necessary, as shown by dashed lines in FIG. 5, insert 238 has a radially outwardly projecting actuating portion 280, cylindrical sleeve 231, support ring 215 and cover 249, which has a slot through which projecting activating portion 280 projects. Thus, even though cover 249 is rotated downward, insert 238 can be rotated. In one embodiment of this invention, in view of the electrical connecting cable or flexible cable 245 between electrical unit 237 and electrical terminals 243, the slot is designed so that the pivot angle range for the light fitting 207 is limited to a certain degree, such as approximately 90°. The combination of mobility of cup 217 and light fitting 207, shown in FIG. 4, is limited to 90° as is indicated by rotation arrows F and F'.

The term "adaptor" is used throughout this specification and it is apparent that by minor modifications such elements can also be in the form of a ballast or other suitable elements.

Figure 8:
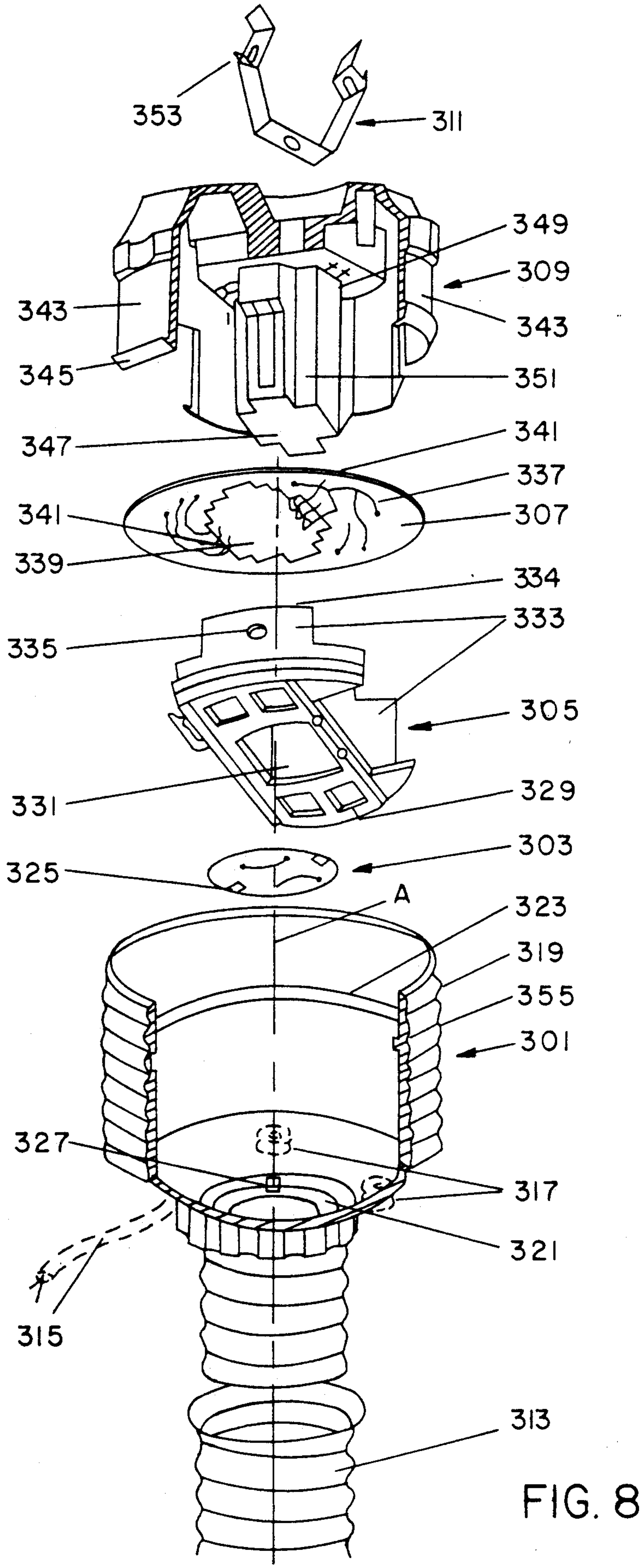
FIG. 8, an exploded view of an inventive adaptor or ballast.

Referring to FIG. 8, the adaptor comprises external casing 301, if necessary, a small printed circuit board 303 is connected to external casing 301. In a preferred embodiment of this invention, although not required, the adaptor further comprises a spreading or expanding bracket 305, a main printed circuit board 307, an inner casing 309 and a holding spring 311.

The external casing 301 is constructed similar to a sleeve and has a standard screw cap 313, or a bayonet-type cap, depending on the socket in which the adaptor is inserted on the main power supply side. If the adaptor is now used as a ballast unit, then screw cap 313 will be replaced by a main power cable which is shown as cable 315 in FIG. 8. Cable 315 is attached to external casing 301 fastening members, such as the threaded bushings 317, as shown by the dashed lines in FIG. 8.

The external wall of the sleeve-like, external casing 301 has a threaded surface 319 which can be screwed into glass or plastic lamp cap, not shown. A metal cooling body ring, such as aluminum and having an internal thread, may be screwed on the external casing 301 for the additional removal of heat produced by adaptor 201. Within the external casing 301, a ring shoulder 321 is formed on the cap side and a circular groove 323 along the inner face of the external sleeve wall. Preferably, external casing 301 is manufactured in one piece from plastic, such as polycarbonate.

Small printed circuit board 303 is manufactured to fit snugly onto ring shoulder 321 and has positioning notches 325 for receiving corresponding positioning cams 327 on ring shoulder 321. Preferably expanding bracket 305 is made of plastic or polycarbonate and is also constructed in one piece and has a base plate 329 with a central reception opening 331. The narrow sides of the base plate 329 are arcuate and support in projecting manner expanding bracket legs 333, on each of whose outsides is shaped a locking cam 335. The main printed circuit board 307 is circular and has conductors 337, and has a central region with reception opening 339.

Figure 9:
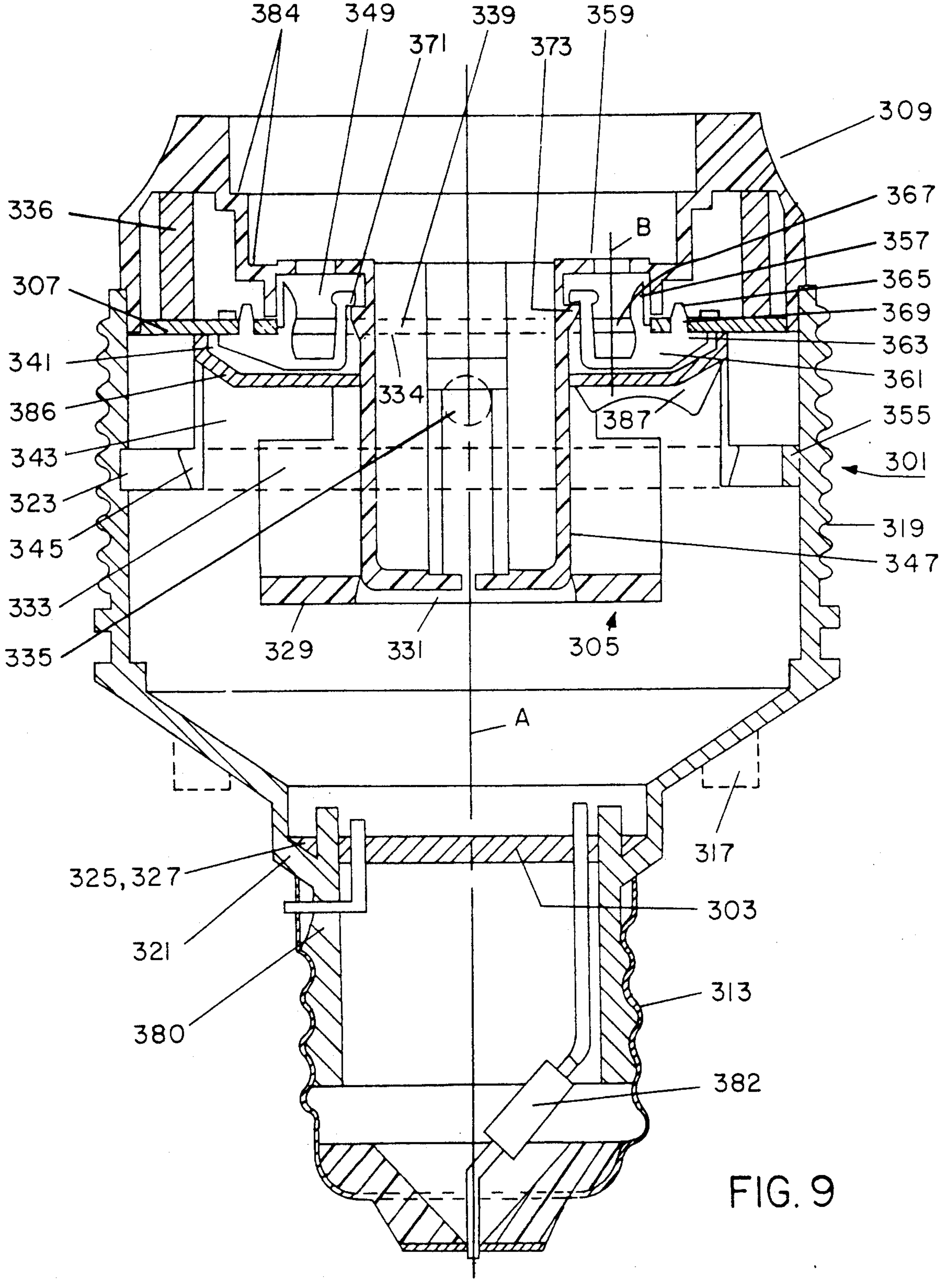
FIG. 9, a partly simplified longitudinal sectional representation of an assembled inventive adaptor.

In a preferred embodiment referring to FIGS. 8 and 9, there are several, in this case three, contact members 341 on each of the two sides of reception opening 339. Referring to FIG. 9, at least two of the contact members 341 are connected to conductors of the printed circuit board 307. However, in each case several contact members 341 with conductors may be provided in an equivalent manner, for example, substantially parallel. Moreover, part of the contact members 341 can be connected with one unit of conductors and other contact members 341 may be connected to another unit of conductors leading to different wiring systems of the printed circuit board. Alternatively, the contact members 341 can at least partly be connected by means of flexible bridges to the conductors 337 or the printed circuit board 307.

Thus, the known light fittings generally have two pins as the contacting connections or terminals. These pins are arranged in different manner as a function of the cap arrangement of the light fitting, but their arrangement follows a standard grid pattern. However, if on printed circuit board 307, as for conventional light fittings, only two contact members 341 were provided then it would only be possible to use only a specific light fitting type, for example, with the arrangement according to G23 d-1 or G24 d-1 or G24 q-1, etc. However, in order to be able to use circuit board 307 for all the standard cap arrangements and the like, more than two contact members 341 are provided. If the pin positions involved are wired by equivalent electrical wiring of the corresponding members 341, all these types can be electrically received, without any modification to circuit board 307. When different electrical requirements occur for different light fittings, contact members 341 can be electrically differently wired. In a preferred embodiment of this invention, the different wiring is not fitted in a fixed manner, but is related to the type of light fitting used and contact members 341 are contacted on the basis of their intended use, such as by means of bridge parts that are soldered in place.

Referring to FIG. 8, inner casing 309 is sleeve-shaped. Inner casing 309 is shaped in one piece from plastic, preferably of polycarbonate. Downwardly projecting wall portions which can be elastically bent inwardly and outwardly within limits and connected to reference numeral 341 terminating in a barb-like, outwardly projecting portion 345. Centrally on inner casing 309, is a downwardly shaped holding part for a light fitting cap (not shown), for example, a socket 347. On either side of socket 347 are recesses 349 corresponding to the number of contact members 341 are provided. The shape of socket 347 allows socket 347 to secure both rectangular and square light fitting caps. Longitudinal ribs 351 are formed, which border both rectangular and different square faces of socket 347 to ensure the caps are adequately secured. This permits in conjunction with the described arrangement of members on the printed circuit board 307, a plurality of different cap-arranged and operated light fittings while maintaining a constant design of the adaptor.

Before going into further detail relative to FIGS. 9 and 10, a description of the mechanical assembly of the adaptor will be given. Holding spring 311 with corresponding holding tongues 343 is inserted and secured from above in the parallelepipedic cavity forming the socket 347 by a plastic weld. The fitted, not shown, board 307 is inserted into the inner casing part with its reception opening 339 over socket shape 347 until contact members 341 project through receptacles 349 provided in inner casing 309 and specially constructed contact members 341 engage on inner casing 309. Contact members 341 are secured to printed circuit board 307, this ensures that the board is secured to the inner casing 309. Expanding bracket 305 with its reception opening 331 engages from below, over socket 347 and further engages with its expanding bracket legs 333 along the inside of wall portions 343 of the inner casing 309. It is dimensioned in such a way that its legs 333 in a wedge-like operation resiliently drive apart within the scope of their inherent elasticity the wall portions 343. Two locking cams 335 projecting outwards from the expanding bracket legs 333 engage in corresponding, not shown, recesses on the inside of wall portions 343, in such a way that the bracket 305 is located in its final position. Expanding bracket 305 having shoulders 334 shaped onto expanding bracket legs 333 comes to rest on the periphery of printed circuit board 307, so that the periphery of the latter is secured and fixed by means of counterbearings 336, shown in FIG. 9, on inner casing 309. The small printed circuit board 303 is then placed on the ring shoulder 321, which provides corresponding electrical connections between boards 303 and 307. Outer casing 301, after bending in wall portions 343 against the expanding pressure produced by bracket 305, is engaged over wall portions 343 until the barb-like shaped-out portions 345 snap into circular groove 323. Referring to FIG. 8, the adaptor is now complete and outer casing 301 can be rotated about the assembly axis A relative to inner casing 309, and portion 345 slides into groove 323. The rotation path is limited by one or more stopping cams 355.

Figure 10:
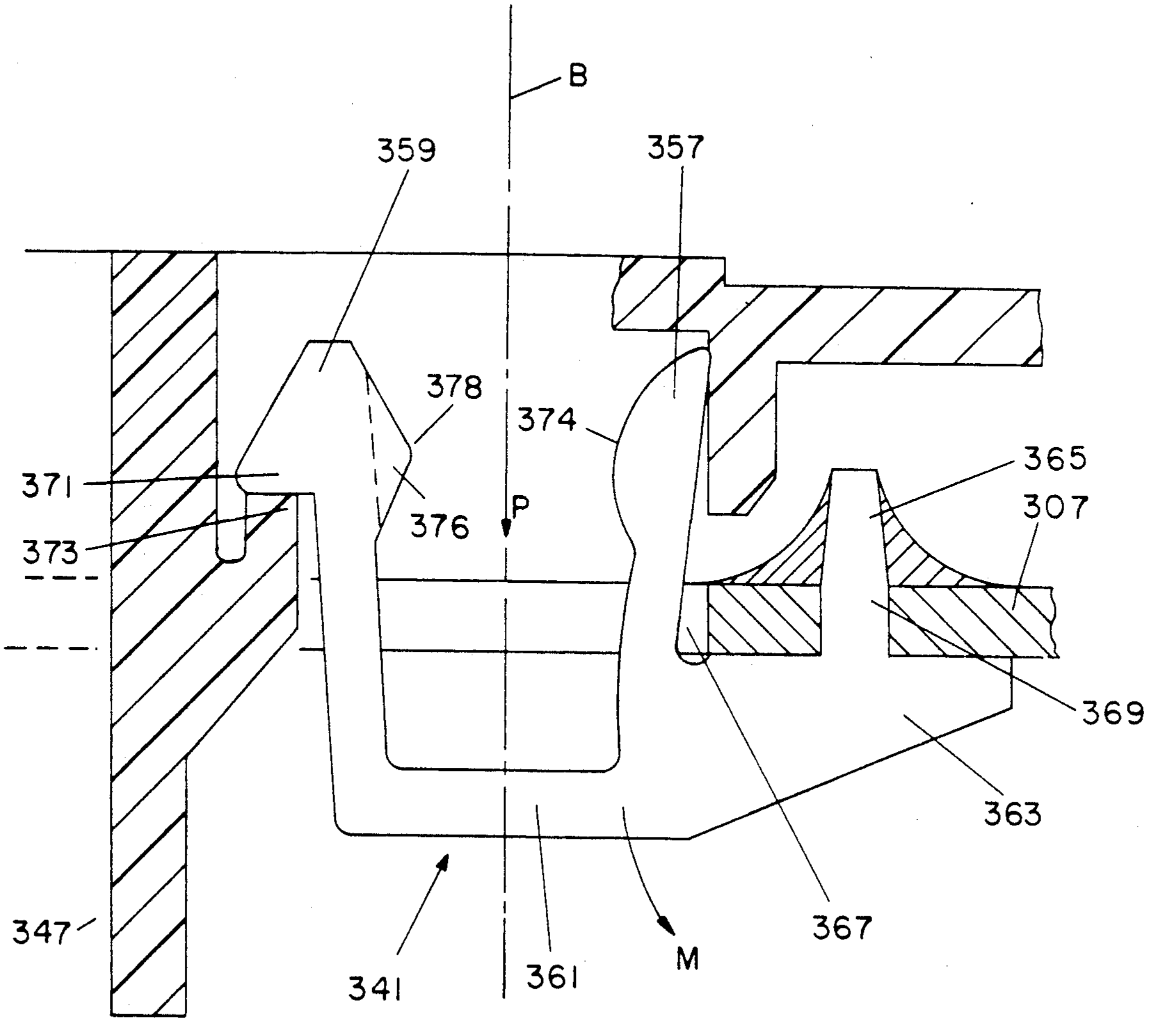
FIG. 10, a larger scale side view of a contact member, as used on the adaptor according to FIGS. 1 and 2.

Referring to FIGS. 9 and 10, further essential details of a preferred embodiment are shown. Contact members 341 generally are U-shaped having two U-legs 357 and 359 and a U-base 361. U-base 361 has an extension portion 363. An assembly pin 365 projects on extension portion 363 parallel to at least one of the U-legs 357 or 359. The main printed circuit board 307 has bores 367 for receiving at least one of the U-legs 357 or 359 and spaced therefrom a bore 369 for assembly pin 365. Contact members 341, which are stamped from plate-like material, are passed through opening 367 from the circuit board side projecting against the external casing 301, assembly pin 365 projects through bore 369 in the board. The top, planar boundary face of extension portion 363 securely engages tightly on the side of circuit board 307. Referring to FIG. 10, assembly pin 365 is soldered onto the opposite side of circuit board 307, so that contact members 341 are rigidly connected to board 307.

Referring to FIG. 10, U-legs 359 of members 341 facing socket 347 have on their opposite side from the U-center axis B, one barb-like shaped-out flange portion 371 which fit into and lock in a corresponding shaped-out flange rest portion 373 in the upper area of socket 347. Socket 347 is constructed of one piece with the inner casing 309.

The flanks of flange 371 and flange support 373 are bevelled in such a way that on inserting the printed circuit board 307 according to FIG. 8 from below over socket 347, U-legs 359 of flange portion 371 bend resiliently against axis B and then in locking manner assume their fixing position over flange support portion 373. Via contact members 341, they support printed circuit board 307 in its central region, for example, the region which is stressed most on inserting a light fitting. As shown in FIG. 10, upon inserting a light fitting-side contact pin at least one of two U-legs 357 or 35 are bent back. The bending back of one of the two U-legs is made possible by the offset construction of flange support portion 373 and also for leg 359; as a result of the stressing P a torque M is produced on contact member 341, which is absorbed by the engagement of extension portion 363 on printed circuit board 307. U-legs 357 and 359 bend resiliently in the plane of the plate-like contact member material. Referring to FIG. 10, each of the two U-legs 357, 359 has a shaped-out portion 374 or 376 directed against the central axis B. Shaped-out bulging portion 374 on leg 357 remote from socket 347 is continuously upwardly curved. Shaped-out portion 376 on leg 359 facing socket 347 has an edge 378. The provision of an edge, such as at 348, on the resilient, contact-receiving U-legs 357 and 359, ensures an optimum contacting of a light fitting pin inserted between U-legs 357 and 359. Impression points are provided on the light fitting pins, normally on the outwardly directed side with respect to the light fitting cap or socket arrangement. If the corresponding U-leg 357 had an edge, at point 378, there would be a risk of it engaging in such an impression, which would make it more difficult or impossible to insert a light fitting. Thus, the shaped-out bulging portion 374 of the corresponding leg 357 is continuously curved.

As shown in FIG. 9, the board support function of shoulder 337 of expanding bracket 333 is shown. Referring to FIG. 9, the electrical terminals 380 or 382 on the mains-side cap can be viewed. The offsets 384, shown in the sectional view of FIG. 9, are intended for the reception of differently dimensioned light fitting caps.

Because the expanding action of expanding bracket-legs 333 with respect to wall portions 343, the barb-like shaped-out portions 345 remain expanded in groove 323. Nevertheless, it is possible to carry out the aforementioned rotation movement between the casing part without difficulty.

FIG. 9 further shows a circular insulating insert 386, which is placed over the contact member portions facing the fitting side of board 307 after inserting board 307 and before inserting expanding bracket 305. This makes it impossible for the contact members 341, such as on the bending up upon inserting a light fitting, to come into contact with the board fitting. This insulating insert 386, as shown on the right-hand side of FIG. 9, is provided with support parts 387 for electronic units, such as resistor coils, capacitors, etc., so that the space taken up by the contact members on the printed circuit board 307 is again utilized.

I claim:

1. An adaptor for fluorescent tubes having contact pins, the adaptor having a fluorescent tube-compatible plug-in socket and an incandescent lamp-compatible screw cap, the adaptor comprising:
- an external casing part (1, 301);
- said external casing part forming said incandescent lamp-compatible screw cap (3, 203);
- a printed circuit board (307) and an inner casing (309);
- said printed circuit board (307) secured to said inner casing (309) which is secured to said external casing part (1,301);
- said inner casing (309) forming said fluorescent tube-compatible plug-in socket (347);
- a plurality of contact members (341) secured to said printed circuit board (307);
- said contact members (341) being electrically connected by conductors (337) on said printed circuit board (307) for creating an electric connection of said inner casing (309) making said inner casing (309) compatible with fluorescent light fittings having differently arranged contact pins; and
- said fluorescent tube-compatible plug-in socket (347) capable of receiving different shaped caps (10, 12) with said differently arranged contact pins of said light fittings.

2. An adaptor according to claim 1 wherein said inner casing (309) forms receptacles (349) which receive said contact pins, said contact members (341) are flexible and secured to said printed circuit board (307), and said contact members (341) are contactable with said contact pins.

3. An adaptor according to claim 1 wherein said inner casing (309) and said external casing (301) rotate relative to one another and said inner casing (309) and said external casing (301) rotate with respect to a connecting center axis (A).

4. An adaptor according to claim 2, wherein said contact members (341) form a U-shaped configuration with resilient U-legs (357, 359), and said U-legs (357, 359) are centered with respect to said receptacles (349) for said contact pins.

5. An adaptor according to claim 1, wherein flange portions (371) extend from said contact members (341) for supporting said printed circuit board (307) on said inner casing (309) and said contact members (341) are contactable with said light fittings (9, 207) for securing said printed circuit board (307).

6. An adaptor according to claim 4, wherein a flange portion (371) projects from an external side of one U-leg (359) of said U-legs which extends from a U-base (361), and a flange support portion (373) of said inner casing (309) supports said printed circuit board (307).

7. An adaptor according to claim 5, wherein a flange portion (371) projects from an external side of one U-leg (359) of said U-legs which extends from a U-base (361), and a flange support portion (373) of said inner casing (309) supports said printed circuit board (307).

8. An adaptor according to claim 7, wherein said flange portion (371) is constructed in barb-like manner, said U-legs (357, 359) project at least approximately parallel to an assembly axis of said printed circuit board (307) and said inner casing (309), in such a way that on assembling said printed circuit board (307) to said inner casing (309), said flange portion (371) resiliently snaps behind said flange support portion (373) on said inner casing (309).

9. An adaptor according to claim 4, wherein at least one U-leg of said U-legs (357, 359) has a shaped-out portion directed against a U-leg central axis having at least one of an edge and a constantly curved edge and another U-leg of said U-legs (357, 359) has a bulging portion (376) directed against said U-leg central axis.

10. An adaptor according to claim 4, wherein an extension portion (363) is on one side of a U-base (361) of U-shaped contact members, said extension portion (363) is secured in a closely engaging manner on one board side and a leg extends through at least one opening of another board side, and an extension portion absorbs stress moments occurring against said printed circuit board (307) on inserting said light fitting.

11. An adaptor according to claim 10 wherein at least one pin (365) of said extension portion (363), projects at least approximately parallel to said U-legs (357, 359) and is shaped approximately in a central region of said extension portion (363), and said pin (365) projects through an opening (369) in said printed circuit board (307) on said board side which is remote from said extension portion (363) connected to said printed circuit board (307).

12. An adaptor according to claim 11 wherein said inner casing (309) further comprises outer faces of resilient wall portions (343), said wall portions (343) engage on an inner wall of said external casing (301), a projecting portion (345) on each said resilient wall portion is expandingly connected to a circular groove (323) on said inner wall of said external casing (301) and an expanding bracket (305) is in locking connection with said external casing (301), whereby expanding action of said expanding bracket on said wall portions (343) of said inner casing (309) connected to said external casing (301) is undetectable in a nondestructive manner after assembly, and said expanding bracket supports said printed circuit board (307).

13. An adaptor according to claim 1 wherein said fluorescent tube-compatible plug-in socket is positioned coaxially to said printed circuit board (307) and a sleeve (351) of said fluorescent tube-compatible plug-in socket projects through said fluorescent tube-compatible plug-in socket.

14. An adaptor according to claim 1 further comprising means for sealing said external casing (301) and said inner casing (309) for using the adaptor in a moist environment.

15. An adaptor according to claim 3 wherein said inner casing (309) and said external casing (301) pivot with one another by a rotation angle limited by stop members.

16. An adaptor according to claim 1 wherein said external casing (301) further comprises fixing members, to which is fixed a lamp cup for encapsulating the light fitting.

17. An adaptor according to claim 16 wherein means for sealing comprises an O-ring arrangement (233, 225) positioned between cup (217) and said external casing (301).

18. An adaptor according to claim 16 wherein said cup (217) has areas of different light transmission and reflected (229, 231).

19. An adaptor according to claim 16 further comprising a thermal sensor (251), an inner shield (253), and an outer thermal cup (261) for adjusting one of cup heat transmission and reflection.

20. An adaptor according to claim 19 wherein said inner shield (253) is coaxially and rotatably arranged in a thermal cup (255), said inner shield (253) and said thermal cup (255) have alternating first segments of high infrared reflection and second segments of infrared transmission, and said thermal sensor (251) controls a relative rotation position of said thermal cup (255) with respect to said inner shield (253).

21. An adaptor according to claim 19 wherein said thermal sensor (251) is a bimetal spiral connected on one side with said inner shield (253) and which on another side is secured.

22. An adaptor according to claim 1 wherein a reflector (247) is connectable to one of said fittings.

* * * * *